(12) United States Patent
Wuu et al.

(10) Patent No.: US 8,958,236 B2
(45) Date of Patent: Feb. 17, 2015

(54) MEMORY CELL FLIPPING FOR MITIGATING SRAM BTI

(71) Applicant: Advanced Micro Devices, Inc., Sunnyvale, CA (US)

(72) Inventors: John J. Wuu, Fort Collins, CO (US); Keith A. Kasprak, Austin, TX (US); Russell Schreiber, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 94 days.

(21) Appl. No.: 13/749,672

(22) Filed: Jan. 24, 2013

(65) Prior Publication Data

US 2014/0204658 A1    Jul. 24, 2014

(51) Int. Cl.
*G11C 7/00*    (2006.01)
*G11C 11/412*    (2006.01)
*G11C 7/04*    (2006.01)

(52) U.S. Cl.
CPC ................ *G11C 11/412* (2013.01); *G11C 7/04* (2013.01)
USPC .......................................................... 365/154

(58) Field of Classification Search
CPC ...................................................... G11C 11/412
USPC ......................................................... 365/154
See application file for complete search history.

(56) References Cited

U.S. PATENT DOCUMENTS 7,310,281 B1 * 12/2007 Hsueh et al. .................. 365/222

* cited by examiner

*Primary Examiner* — Hoai V Ho
(74) *Attorney, Agent, or Firm* — Liang & Cheng, PC

(57) ABSTRACT

An apparatus may comprise a memory cell configured to operate according to a voltage mode, a voltage controller coupled with the memory cell, wherein the voltage controller is configured to change the voltage mode of the memory cell between a low voltage mode and a high voltage mode, and a memory controller module coupled with the memory cell, wherein the memory controller is configured to invert a logic state stored in the memory cell based on the voltage mode.

20 Claims, 4 Drawing Sheets

MEMORY CELL FLIPPING FOR MITIGATING SRAM BTI

TECHNICAL FIELD

This disclosure relates to the field of memory devices and, in particular, to flipping of memory cells in a memory device.

BACKGROUND

Static random access memory (SRAM) is a type of semiconductor memory that uses bistable latching circuitry to store each bit. Each memory cell of a SRAM memory array may be a bit cell used to store a single bit of information. Each of these bit cells may further include a number of transistors that may be biased by an operating voltage while a bit is being stored in the bit cell.

In the course of normal operation of the memory cell, some of these transistors may be subject to bias temperature instability (BTI), which may alter the threshold voltages of the transistors. BTI thus degrades the performance of the memory device over time. In the case of memory cells such as SRAM bit cells, BTI can introduce device mismatch depending on the duty cycle of the bit cell logic state. This device mismatch may further result in unbalanced "1" and "0" states, degrading the bit cell's stability and writability.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the spirit and scope of the embodiments.

Bias temperature instability (BTI) may occur in situations where a bias voltage applied across a gate and source of a transistor degrades the transistor over time, resulting in a change in the threshold voltage of the transistor. N-type field effect transistors (NFETs) may be susceptible to positive bias temperature instability (PBTI), which is a positive bias on the gate of the NFET, while P-type field effect transistors (PFETs) may be susceptible to negative bias temperature instability (NBTI), which is a negative bias on the gate of the PFET. In either of these cases, the BTI effect may cause the absolute value of the threshold voltage to increase. BTI effects may also cause the standard deviation of the threshold voltage to increase.

When transistors susceptible to BTI are used in memory devices, the BTI effects can introduce device mismatch between the transistors over time; in other words, transistors designed to have identical operating characteristics may over time become mismatched, resulting in unbalanced "1" and "0" states. Thus, the stability and writability of the memory may be degraded over time by the BTI effects. The mismatch caused by BTI may also result in an increase the minimum operating voltage that may be reliably used for operating the memory, and a decrease in the maximum operating voltage that may be reliably used for operating the memory.

In one embodiment, the duty cycles of the logic states held by the transistors may determine the amount of mismatch between the transistors. For example, a memory bit cell that stores a "1" for significantly more time than it stores a "0" may be subject to BTI effects that degrade the transistors unevenly. Accordingly, one technique for reducing the mismatch caused by BTI involves regularly "flipping", or inverting, the logic state stored in the memory cell to achieve a duty cycle for the bit that is closer to 50%, so that the transistors degrade similarly and remain more closely matched.

Figure 1:
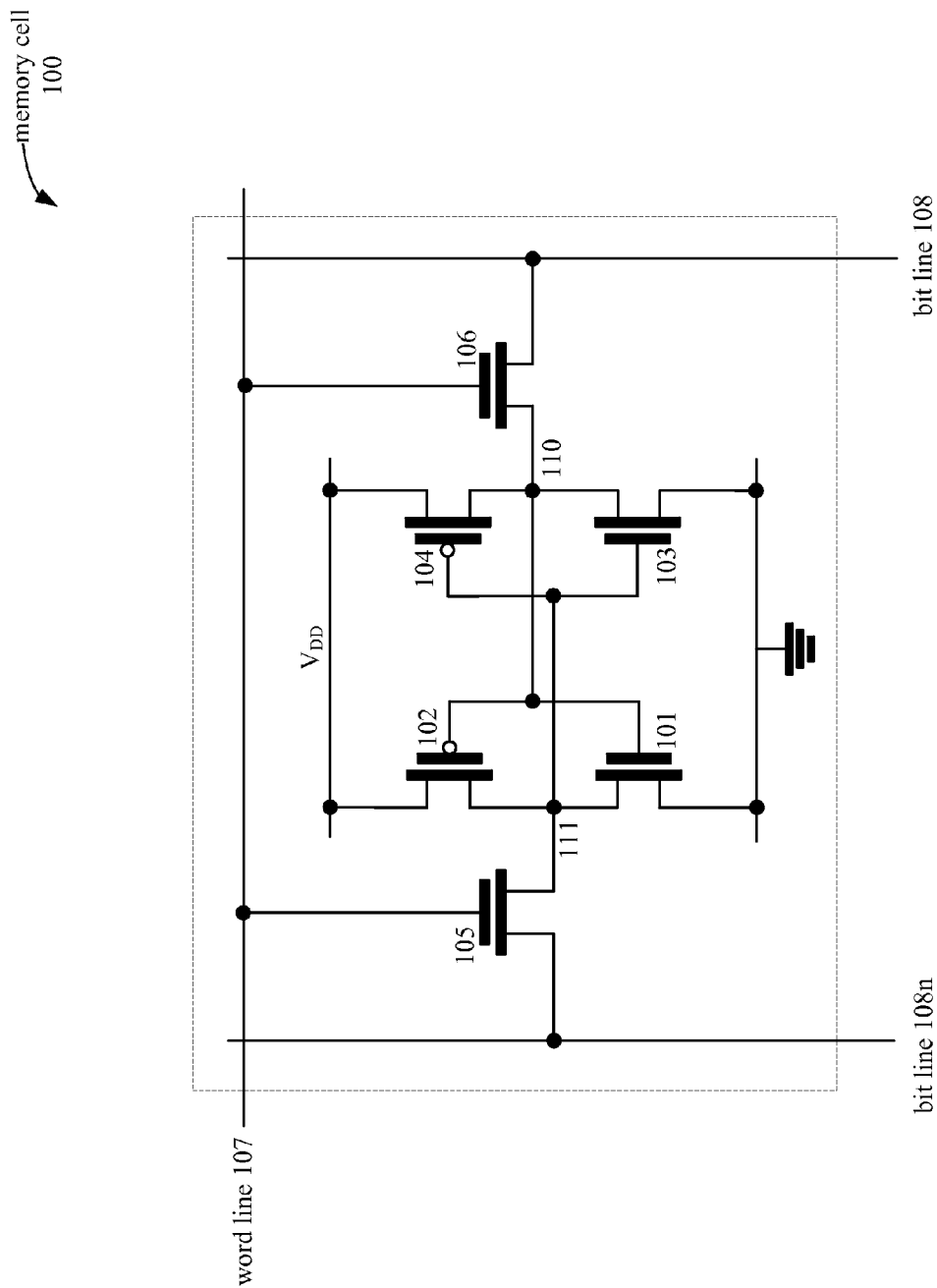
FIG. 1 illustrates an embodiment of a memory cell.

FIG. 1 illustrates an embodiment of a memory cell 100 for which the above-described memory cell flipping method may be used. The memory cell 100 includes a first inverter formed by transistors 101 and 102 that is cross coupled with a second inverter formed by transistors 103 and 104. The cross-coupled inverters form a bistable storage cell with two stable states used to store a logical "1" or "0". During a read operation, the word line 107 may be used to turn on the access transistors 105 and 106 to allow the logic state of the stored bit and the inverted logic state of the stored bit to be read via bit lines 108 and 108n. During a write operation, the logic state to be written is applied to the bit line 108 and the opposite logic state is applied to 108n. The logic states may then be stored in the memory cell 100 when the word line 107 is asserted; the voltages applied to the bit lines 108 and 108n override the previously stored state of the cross-coupled inverters. In a memory cell such as memory cell 100, stability for both the "1" and "0" logic states is achieved by symmetrical transistors. In practice, a memory cell may be designed to tolerate a specific amount of variation from ideal symmetry based on the size and desired manufacturing yield of the memory devices.

In one embodiment, when a "1" is stored in the memory cell 100, a high voltage (such as an operating voltage of the memory cell) may be applied to bit line 108, which is then latched into node 110. Concurrently, a low voltage (such as ground) may be maintained at node 111, which is applied to the gate of P-type transistor 104. Thus, with a high voltage applied at the both the source and drain of transistor 104 and a low voltage at the gate of transistor 104, transistor 104 is negatively biased and may be susceptible to BTI effects that may alter the threshold voltage of transistor 104 over time. In contrast, transistor 102 is not negatively biased because the voltage at node 110 is greater than the voltage at node 111; thus, transistor 102 does not suffer from BTI effects when a logical "1" is stored in the memory cell 100. Transistors 102 and 104 may thus become mismatched over time if a logical "1" is consistently stored in the memory cell 100 for a duty cycle significantly exceeding 50%.

In one embodiment, continuously flipping logic states stored in the memory cells may reduce the BTI-induced mismatch between transistors, but may increase power consumption and decrease performance of the memory. For example, bit-flipping operations may block normal memory array access operations, such as read and write operations. Also, flipping of the memory cells may utilize array operations that increase the overall dynamic power consumption.

In one embodiment, BTI effects may be aggravated by higher temperatures, higher bias voltages, or longer durations for which the bias voltage is applied. Accordingly, when the temperature is lower, the bias voltage is lower, or the duration for which the bias voltage is applied is shorter, the effect of BTI is less significant.

In one embodiment, because of the high sensitivity of BTI to voltage, one method for mitigating BTI effects may involve flipping the logic states of the memory cells only during certain voltage conditions. For example, in a memory array that may operate using a dynamically varying operating voltage, the memory cells may be flipped more often during periods when a high operating voltage is being used. Voltage conditions, such as the voltage mode that determines the operating voltage or the operating voltage itself, may be sensed or otherwise determined and may be used to determine whether and when the memory cells are flipped. The effects of BTI-induced device mismatch may thus be mitigated and the power consumption and performance penalty caused by the memory cell flipping operations may be reduced, as compared to a memory cell flipping method that is not informed by voltage conditions.

One embodiment of a memory array may be able to operate according to multiple voltage modes, such as a high voltage mode and a low voltage mode. For example, when operating in the high voltage mode, the memory array may use a higher operating voltage (e.g., $V_{DD}$) than when operating in the low voltage mode. In other words, when operating in the high voltage mode, the high voltage level of memory array may be higher than the high voltage level of the memory array when operating in the low voltage mode. Note that "high operating voltage" refers to a high voltage level of the memory array (e.g., $V_{DD}$) when the memory array is operating in the high voltage mode. Similarly, "low operating voltage" refers to a high voltage level of the memory array (e.g., $V_{DD}$) when the memory array is operating in the low voltage mode.

In one embodiment, the memory cells of the memory array may be flipped periodically while the memory array is operating in the high voltage mode, but not when the memory array is operating in the low voltage mode. In one embodiment, the periodic flipping of memory cells may begin after the memory array has been operating in the high voltage mode for longer than the duration of a predetermined timeout. For instance, a memory controller may begin periodically flipping the memory cells of the memory array after the expiration of such a timeout.

In one embodiment, the operating voltage of the memory array may be temporarily boosted, such that the memory array spends substantially less time operating in the high voltage mode than in the low voltage mode. In such an embodiment, the memory cells of the memory array may be flipped based on transitions into or out of the high voltage mode. In one embodiment, the memory cells may be flipped once for each time the memory controller transitions from the high voltage mode to the low voltage mode.

Figure 2:
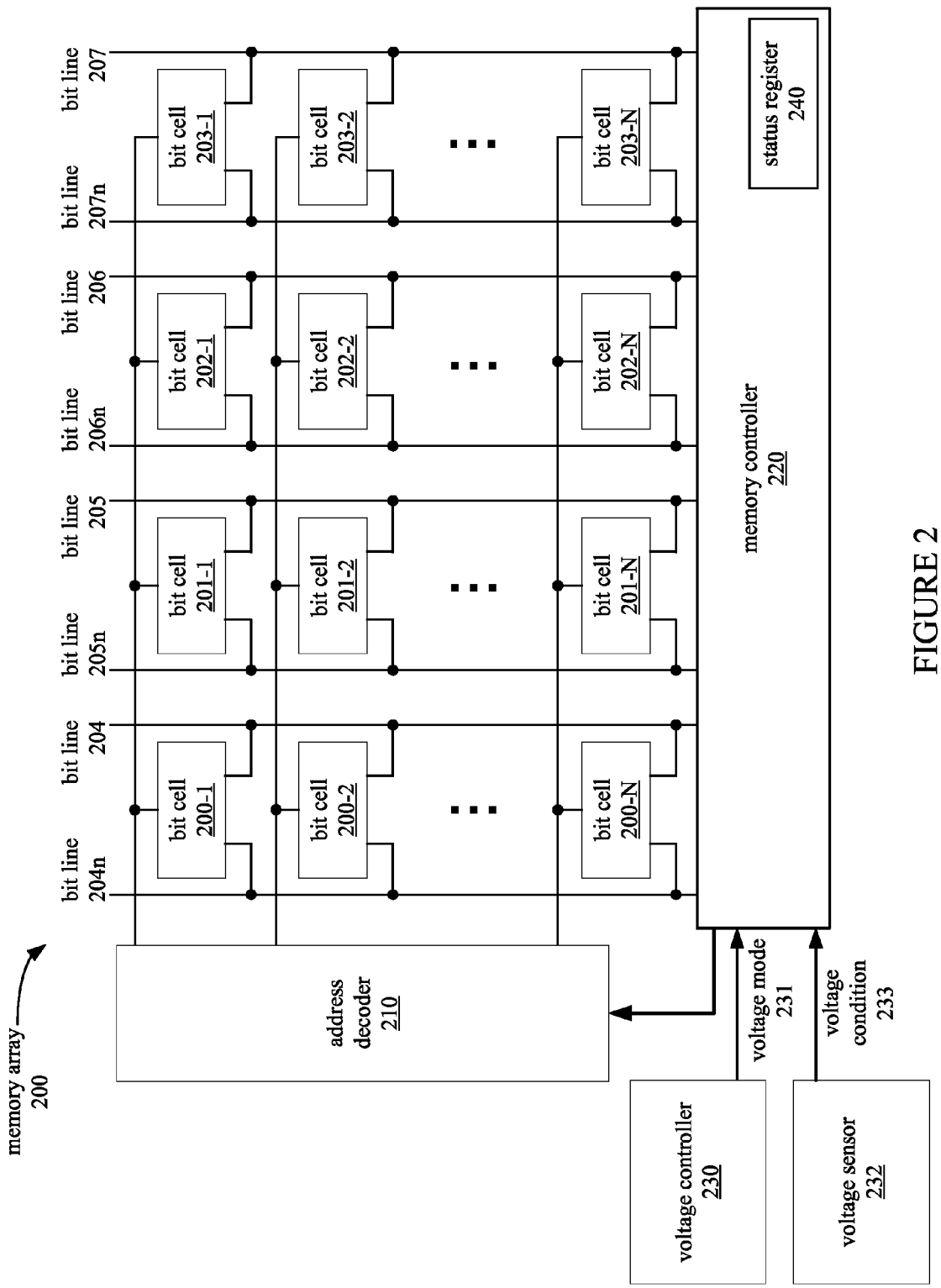
FIG. 2 illustrates an embodiment of an array of memory cells.

FIG. 2 illustrates an embodiment of a memory array 200 in which the memory cells may be flipped to mitigate the effects of BTI. In one embodiment, the flipping of memory cells may be performed to mitigate the effects of other types of degradation caused by voltage. Memory array 200 includes a number of memory cells 200-1 through 200-N, 201-1 through 201-N, 202-1 through 202-N, and 203-1 through 203-N. In one embodiment, each of the memory cells is a 6T SRAM bit cell, similar to memory cell 100, illustrated in FIG. 1.

The array of memory cells is connected to a memory controller 220 that performs operations such as reading or writing to the memory cells. The memory controller 220 may select a word to be read or written via the address decoder 210, and may read or write the individual bits via the bit lines 204-207 and 204n-207n.

In one embodiment, the voltage controller 230 may be coupled with each of the memory cells to control the operating voltage used by the memory cells. In one embodiment, the voltage controller 230 may be able to change the voltage mode of the memory cells between a low voltage mode and a high voltage mode, such that the operating voltage (or the high voltage level) used by the memory cells can be changed between a low voltage and a high voltage, respectively. In one embodiment, the voltage controller 230 may be omitted and the functions of the voltage controller 230 may be performed by the memory controller 220 or other module.

In one embodiment, each of the memory cells 200-1 through 203-N may support operation in the low voltage mode or the high voltage mode. When operating in the low voltage mode, each memory cell may store a bit's logic state by applying a low operating voltage to the gates of the appropriate transistors within the memory cell, as previously described with reference to FIG. 1. In contrast, when operating in the high voltage mode, each memory cell may store the bit's logic state by applying a higher operating voltage to the gates of the appropriate transistors within the memory cell.

In one embodiment, the voltage controller 230 may change the voltage mode 231 in response to a voltage mode identification (ID) value retrieved from a register or received as a signal, where the voltage mode ID indicates the voltage mode in which the memory array should be operating. In alternative embodiments, the voltage mode ID may be stored within the voltage controller 230 itself.

In one embodiment, the voltage mode ID may be transmitted to the memory controller 220 via signal pathway 231, so that the memory controller can perform memory cell flipping operations in response to the voltage mode or to changes in the voltage mode. In one embodiment, a voltage sensor 232 may be used to determine one or more voltage conditions which may be transmitted to the memory controller 220 via signal 233. Memory controller 220 may then perform the memory cell flipping operations in response to the one or more voltage conditions 233. For example, the memory controller 220 may perform periodic flipping of the memory cells when the voltage sensor 232 senses a high operating voltage. In one embodiment, the memory controller 220 may perform memory cell flipping in response to a change in the voltage mode. In one embodiment, the memory controller 220 may perform the flipping of the memory cells in response to the voltage mode or voltage conditions by inverting the logic state of each bit stored in the memory cells.

In one embodiment, a memory array that is capable of operating according to a low voltage mode or a high voltage mode may operate normally in the low voltage mode, entering the high voltage mode for relatively short periods of time where the operational voltage is temporarily boosted. In such a memory array, the memory controller 220 may perform the flipping of memory cells after each time the memory array exits the high voltage mode. In one embodiment, the memory controller 220 may increment through all the memory addresses to flip each memory cell once in response to detecting a transition from the high voltage mode to the low voltage mode.

By flipping the memory cells after each transition from high voltage mode to low voltage mode, the memory controller 220 reduces the effect of BTI on memory cells retaining the same data over long periods of time; these memory cells could otherwise repeatedly enter and exit the boosted high voltage modes while retaining the same data. In one embodiment, BTI degradation at low voltage modes can be considered negligible, such that flipping of the memory cells during the low voltage mode can be avoided without resulting in significant device mismatch, thereby reducing the performance and power overhead.

In alternative embodiments, the memory controller 220 may perform memory cell flipping operations in response to a transition from the low voltage mode to the high voltage mode. In some embodiments, the memory array may support operation in more than two voltage modes, and the flipping of the memory cells may be performed in response to a transition from one of the voltage modes to another of the voltage modes.

In one embodiment, a memory array 200 capable of operating in more than one voltage mode may operate in a high voltage mode continuously for an extended duration. In one embodiment, for such extended operation in a high voltage mode, the memory controller 220 may be configured to periodically flip the logic states of the bits stored in the memory cells while the memory array 200 is operating in the high voltage mode.

In one embodiment, the memory controller 220 may begin the periodic inverting in response to the operation of the memory cell in the high voltage mode for longer than a predetermined time, which may be represented as a timeout value. For example, a timer may be started in response to detecting a voltage mode transition to a high voltage mode or in response to detecting a high voltage condition, and the periodic memory cell flipping may begin in response to the timer reaching the timeout value. In one embodiment, the memory controller 220 may cease the periodic flipping of memory cells in response to detecting a transition of the voltage mode from the high voltage mode back to the low voltage mode, when the effects of BTI may be considered negligible.

In one embodiment, the memory controller 220 may include a status register 240 that stores a status bit indicating whether or not the memory cells are in a flipped, or inverted, state. The memory controller 220 may be configured to toggle the status bit in connection with flipping the logic state of the bits stored in the array of memory cells, when such flipping is performed in response to the voltage mode or to a change in the voltage mode as previously described. For example, the status bit may have a logic state of "0" when the memory cells in the array 200 are in an unflipped state, and may have a logic state of "1" when the memory cells are in a flipped state. The memory controller may toggle the status bit once for each time the memory cells are flipped to ensure that the status bit continues to accurately indicate whether or not the memory cells are flipped. In one embodiment, the status register 240 may store a status bit corresponding to each set of memory cells in which the memory cells are flipped together, where the corresponding status bit indicates whether the set of memory cells is in a flipped state.

In one embodiment, the status bit may be read by the memory controller 220 when reading or writing to the memory cells. If the status bit indicates that the logic states of the bits stored in the memory cells are flipped, the memory controller 220 may invert bits to be written to the memory cells before writing them, and may invert any bits that are read from the memory cells.

Figure 3:
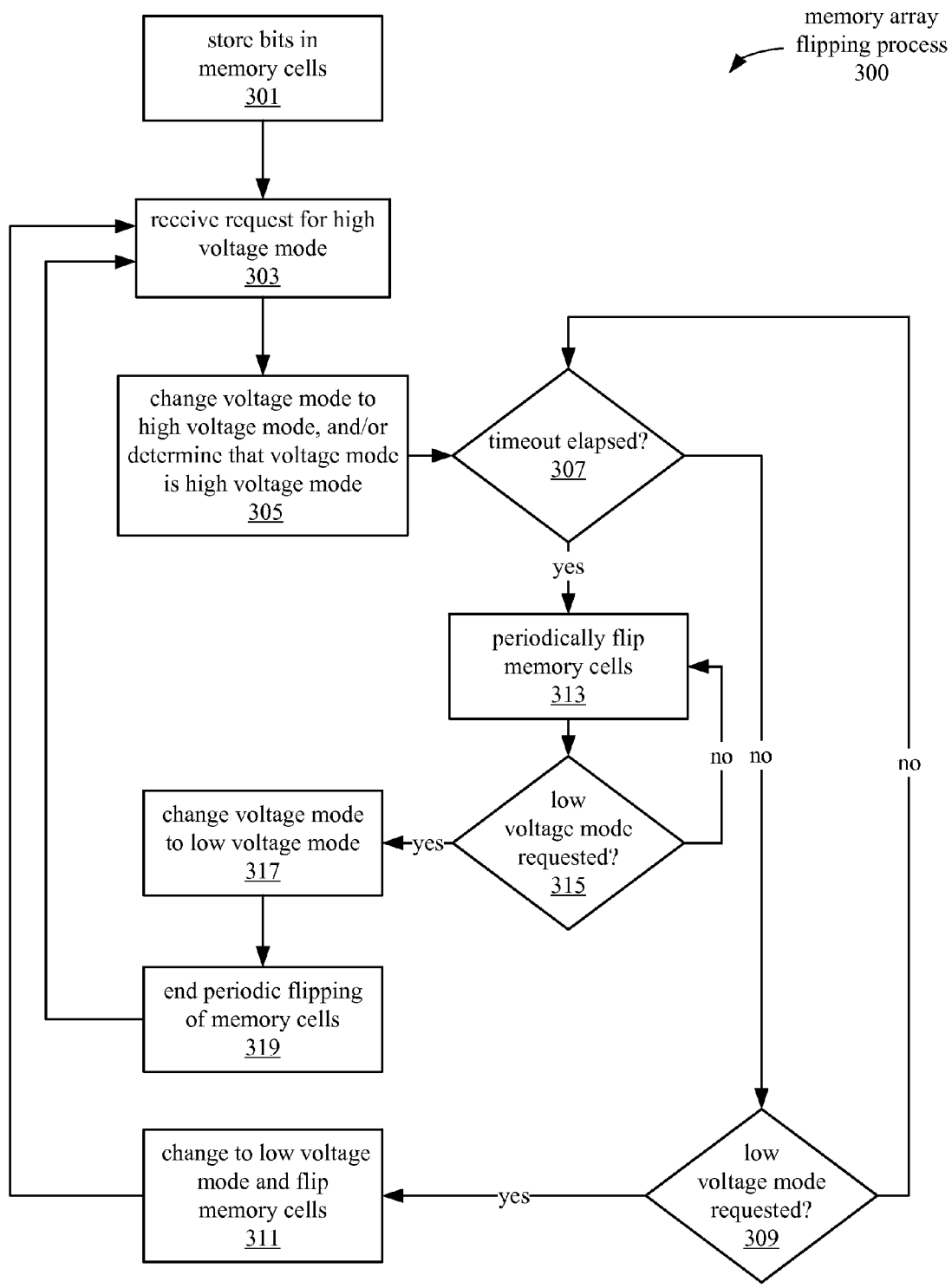
FIG. 3 is a flow diagram illustrating an embodiment of a process for flipping logic states of bits stored in an array of memory cells based on voltage conditions.

FIG. 3 illustrates an embodiment of a memory array flipping process 300 including operations that may be performed by the components of memory array 200, including the memory cells of array 200, memory controller 220, voltage controller 230, and voltage sensor 232. In one embodiment, operations such as reading and writing of the memory cells may be performed in between or during the operation of the blocks illustrated as part of process 300 in FIG. 3.

At block 301, each of the memory cells of array 200 may store a bit of data by maintaining a particular logic state for the bit within the memory cell. In one embodiment, each memory cell may be a 6T SRAM cell that stores a "1" or "0" logic state as previously described with reference to FIG. 1. From block 301, the process 300 continues at block 303.

At block 303, the voltage controller 230 may receive a request to change the voltage mode of the memory array 200 to a high voltage mode. In one embodiment, the request may be in the form of a value written to a register, such as a voltage mode ID, or may alternatively be received in the form of some other signal. From block 303, the process 300 continues at block 305.

At block 305, the voltage controller 230 may change the voltage mode of the memory array 200 to a high voltage mode in response to the request received at block 303. In one embodiment, the memory controller 220 may also determine the current voltage mode in which the memory array 200 is operating. For example, the memory controller 200 may determine based on the signals 231 or 233 that the memory array 200 is operating in the high voltage mode.

In one embodiment, at block 305, the voltage sensor 232 may sense the operating voltage and transmit a voltage condition signal 233 to the memory controller 220 when the operating voltage of the memory array exceeds a threshold voltage. From block 305, the process continues at block 307.

At block 307, the memory controller 220 determines whether a timeout has elapsed. This timeout may be a predetermined duration that the memory controller allows to elapse before beginning periodic flipping of the memory cells. In one embodiment, the duration of the timeout may be long enough so that periodic flipping of memory cells does not start in response to transient boosting of the operating voltage into high voltage mode, where the memory array 200 operates in the high voltage mode for less than the duration of the timeout.

Accordingly, while the timeout at block 307 has not elapsed, the process 300 may continue to block 309, where the voltage controller 230 determines whether low voltage mode has been requested. If low voltage mode is not requested, then the process 300 continues back to block 307 to continue waiting for the timeout to elapse.

If, at block 309, the low voltage mode has been requested, the process 300 continues at block 311, where the voltage controller 230 changes the voltage mode to the low voltage mode. The memory controller may then flip the logic state of the bits in the memory array. From block 311, the memory array 200 operates in low voltage mode until a request to transition to high voltage mode is received, as provided at block 303.

Referring back to block 307, if the timeout elapses after the voltage mode has been changed to the high voltage mode or has been otherwise determined to be the high voltage mode, then the process 300 continues at block 313. In one embodiment, the process 300 may continue at block 313 when the timeout has elapsed after the operating voltage has been determined by the voltage sensor 232 to have exceeded a threshold voltage, as described at block 305.

At block 313, the memory controller 220 may begin to periodically flip the logic states of the memory cells in memory array 200. In one embodiment, after the periodic flipping of the memory cells has begun, the memory controller 220 may periodically flip each memory cell in response to a timer or other recurring signal. In one embodiment, the memory controller 220 may flip the memory cells in sequence by incrementing through the addresses for the memory cells. Alternatively, the memory cells may be flipped in a non-sequential order, or may be flipped substantially simultaneously. From block 313, the process 300 continues at block 315.

At block 315, the voltage controller 230 may determine whether a request has been received to change the voltage mode to the low voltage mode. If no such request has been received, the process 300 continues back to block 313, where the memory controller 220 continues to periodically flip the logic states of the bits stored in the memory cells. If, at block 315, a request has been received for low voltage mode, the process 300 continues to block 317.

At block 317, the voltage controller 230 changes the voltage mode to the low voltage mode in response to the request received at block 315. From block 317, the process 300 continues at block 319.

At block 319, since the memory array is operating in low voltage mode, the effects of BTI may be considered to be negligible and the memory controller ends the periodic flipping of logic states for the bits stored in the memory cells. From block 319, the memory array 200 continues operating in low voltage mode until a request for high voltage mode is received, as provided at block 303.

Figure 4:
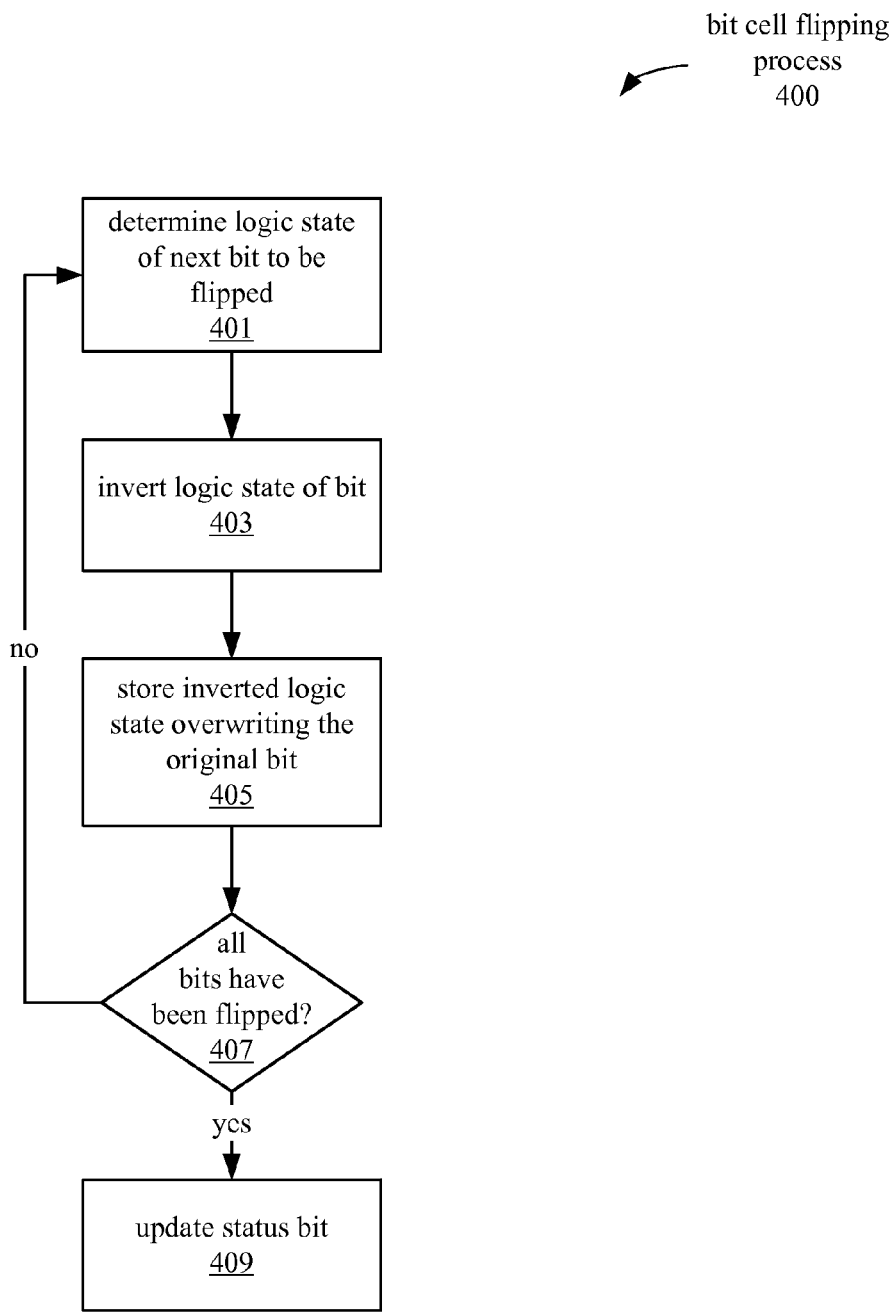
FIG. 4 is a flow diagram illustrating an embodiment of a process for flipping a logic state of individual bits stored in a memory cell.

FIG. 4 illustrates an embodiment of a bit cell flipping process 400 that may be performed by a memory controller 220 on bit cells for which the logic states are to be flipped, such as memory bit cell 100. In one embodiment, the operations performed as part of process 400 may correspond to the flipping of memory cells in connection with the operations of block 313 in FIG. 3. In one embodiment, the process 400 may be performed periodically in accord with block 313. In one embodiment, the process 400 may be performed by logic residing within the memory controller 220, or otherwise coupled with the memory cells in array 200.

In one embodiment, the process 400 may be used to flip every bit that is stored in a specific set of memory cells. For example, the set of memory cells to be flipped may include all of the memory cells in the entire memory array 200, or may alternatively include a subset of these memory cells, such as a row or column of the memory cells. Accordingly, the status register 240 may store a status bit associated with each set of memory cells that is independently flipped, to indicate whether that particular set of memory cells is in an inverted state.

At block 401, the memory controller 220 may determine the logic state of the bit to be flipped. In one embodiment, determining the logic state of the bit to be flipped may include performing a read operation on the bit. In one embodiment, data read from the memory cells in connection with a memory cell flipping operation may additionally be forwarded to satisfy a functional read request. From block 401, the process 400 continues to block 403.

At block 403, the memory controller may invert the logic state of the bit that is identified at block 401. For example, a "1" logic state would be inverted to a "0" logic state and a "0" would be inverted to a "1". From block 403, the process 400 continues at block 405.

At block 405, the memory controller 220 may store the inverted logic state, overwriting the original bit in the memory bit cell that is being flipped. From block 405, the process 400 continues at block 407.

At block 407, if all of the bits in the set of memory cells to be flipped have not yet been flipped, then the process 400 continues back to block 401, where the process 400 continues with flipping the bit stored in the next memory cell. If, at block 407, all of the bits have been flipped, then the process 400 continues at block 409.

At block 409, the memory controller 220 may update the status bit. In one embodiment, the status bit indicates whether or not the logic states of the corresponding set of bits is in an inverted state. In some embodiments, the status bit may also be used to indicate other information pertaining to the memory cell flipping operation. For example, the status bit may indicate for a particular set of memory cells whether the set of memory cells is currently being flipped so that read or write requests can be queued until after the flipping operation is complete.

Embodiments described herein may include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the memory array 200 and supporting modules as illustrated in FIG. 2 such as 210, 220, 230, 232 and/or portions of said memory array 200 and/or modules carried on the computer-readable storage medium may be a database or other data structure which can be read by a program and used, directly or indirectly, to fabricate the hardware comprising the memory array 200 and/or supporting modules. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the memory array 200 and/or supporting modules. The netlist may then be placed and routed to produce a data set describing geometric shapes to be applied to masks. The masks may then be used in various semiconductor fabrication steps to produce a semiconductor circuit or circuits corresponding to the memory array 200 and/or supporting modules. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader spirit and scope of the embodiments as set forth in the appended claims. The specification and drawings are, accordingly, to be regarded in an illustrative sense rather than a restrictive sense.

What is claimed is:

1. An apparatus, comprising:
a memory cell configured to operate according to a voltage mode;
a voltage controller coupled with the memory cell, wherein the voltage controller is configured to change the voltage mode of the memory cell between a low voltage mode and a high voltage mode, wherein during operation in the low voltage mode a first logic state in the memory cell corresponds to a low voltage and a second logic state in the memory cell corresponds to a low operating voltage that is higher than the low voltage, and wherein during operation in the high voltage mode the second logic state corresponds to a high operating voltage that is higher than the low operating voltage; and
a memory controller module coupled with the memory cell, wherein the memory controller is configured to invert a logic state stored in the memory cell based on the voltage mode.

2. The apparatus of claim 1, wherein the memory cell comprises a six-transistor static random access memory (6T SRAM) bit cell.

3. The apparatus of claim 1, wherein the memory cell further comprises a plurality of transistors, wherein during operation in the low voltage mode, the memory cell is configured to store the second logic state by applying the low operating voltage to a gate of at least one of the plurality of transistors, and wherein during operation in the high voltage mode the memory cell is configured to store the second logic state by applying the high operating voltage to the gate of the at least one of the plurality of transistors.

4. The apparatus of claim 1, further comprising a status bit register configured to store a status bit, wherein the memory controller is further configured to toggle the status bit in connection with inverting the logic state stored in the memory cell in response to the change of the voltage mode.

5. The apparatus of claim 1, wherein the memory controller module is configured to invert the logic state periodically during operation of the memory cell according to the high voltage mode.

6. The apparatus of claim 5, wherein the memory controller is configured to begin the periodic inverting of the logic state in response to the operation of the memory cell in the high voltage mode for longer than a predetermined time.

7. The apparatus of claim 5, wherein the memory controller is configured to end the periodic inverting of the logic state in response to a change of the voltage mode from the high voltage mode to the low voltage mode.

8. The apparatus of claim 1, wherein the memory controller module is further configured to invert the logic state of the memory cell in response to a change of the voltage mode from the high voltage mode to the low voltage mode.

9. A method, comprising:
storing a bit in a memory cell, the bit having one of a first logic state corresponding to a low voltage and a second logic state corresponding to an operating voltage higher than the low voltage, by applying the operating voltage to a gate of at least one transistor of the memory cell, wherein the operating voltage is selected based on a voltage mode of the memory cell;
determining the operating voltage of the memory cell; and
inverting a logic state of the bit in response to determining that the operating voltage exceeds a threshold voltage.

10. The method of claim 9, wherein inverting the logic state of the bit comprises:
determining a current logic state of the bit; and
storing a logic state different from the current logic state in the memory cell.

11. The method of claim 9, further comprising:
operating the memory cell according to a low voltage mode; and
changing the voltage mode of the memory cell from the low voltage mode to a high voltage mode.

12. The method of claim 11, further comprising:
during operation in the low voltage mode, storing the bit by applying an operating voltage that is a low operating voltage to a gate of at least one of a plurality of transistors of the memory cell; and
during operation in the high voltage mode storing the bit by applying an operating voltage that is higher than the low operating voltage to the gate of the at least one of the plurality of transistors of the memory cell.

13. The method of claim 11, further comprising toggling a status bit in connection with inverting the logic state based on the change of the voltage mode.

14. The method of claim 11, further comprising periodically inverting the logic state when the voltage mode of the memory cell is a high voltage mode.

15. The method of claim 14, further comprising beginning the periodic inverting of the logic state in response to operation of the memory cell in the high voltage mode for longer than a predetermined time.

16. The method of claim 11, further comprising inverting the logic state of the memory cell in response to a change of the voltage mode from a high voltage mode to a low voltage mode.

17. An apparatus, comprising:
an array of memory cells configured to operate according to a voltage mode;
a voltage controller coupled with the array, wherein the voltage controller is configured to change the voltage mode of the array between a low voltage mode and a high voltage mode, wherein during operation in the low voltage mode a first logic state in the array of memory cells corresponds to a low voltage and a second logic state in the array of memory cells corresponds to a low operating voltage that is higher than the low voltage, and wherein during operation in the high voltage mode the second logic state corresponds to a high operating voltage that is higher than the low operating voltage; and a memory controller module coupled with the array, wherein the memory controller is configured to invert a logic state of each bit stored in the array of memory cells in response to a change in the voltage mode.

18. The apparatus of claim 17, further comprising a status register configured to store a status bit, wherein the memory controller module is further configured to toggle the status bit in connection with inverting the logic state of each bit stored in the array of memory cells.

19. The apparatus of claim 17, wherein the memory controller module is configured to periodically invert the logic state of each bit stored in the array during operation of the array in the high voltage mode.

20. The apparatus of claim 17, wherein the memory controller module is further configured to invert the logic state of each bit stored in the array in response to a change of the voltage mode from the high voltage mode to the low voltage mode.

* * * * *